US009231155B2

(12) United States Patent
Kuraoka et al.

(10) Patent No.: US 9,231,155 B2
(45) Date of Patent: Jan. 5, 2016

(54) COMPOSITE SUBSTRATES, A METHOD OF PRODUCING THE SAME, A METHOD OF PRODUCING FUNCTIONAL LAYERS MADE OF NITRIDES OF GROUP 13 ELEMENTS, AND FUNCTIONAL DEVICES (71) Applicant: NGK INSULATORS, LTD., Aichi-prefecture (JP)

(72) Inventors: Yoshitaka Kuraoka, Okazaki (JP); Makoto Iwai, Kasugai (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/140,234

(22) Filed: Dec. 24, 2013

(65) Prior Publication Data
US 2014/0103362 A1  Apr. 17, 2014

Related U.S. Application Data (63) Continuation of application No. PCT/JP2013/070264, filed on Jul. 19, 2013.

(30) Foreign Application Priority Data

Aug. 30, 2012  (JP) ................................ 2012-190532

(51) Int. Cl.
*H01L 33/32* (2010.01)
*C30B 19/12* (2006.01)
(Continued)

(52) U.S. Cl.
CPC .............. *H01L 33/32* (2013.01); *C30B 19/02* (2013.01); *C30B 19/12* (2013.01); *C30B 29/406* (2013.01); *C30B 33/06* (2013.01);
(Continued)

(58) Field of Classification Search
CPC ........................ C30B 29/403; H01L 21/02625
USPC ................................ 257/76; 438/46, 503, 504
See application file for complete search history.

(56) References Cited

U.S. PATENT DOCUMENTS 7,309,534 B2 * 12/2007 Kitaoka et al. ................. 428/698
7,459,025 B2 * 12/2008 Lee .................................. 117/88
(Continued)

FOREIGN PATENT DOCUMENTS

JP  2000-327495 A  11/2000
JP  2004-247711 A  9/2004
(Continued)

OTHER PUBLICATIONS

Hao, M., et al., "Formation chemistry of high-density nanocraters on the surface of sapphire substrates with an insitu etching and growth mechanism of device-quality GaN films on the etched surface," Applied Physics Letters 2004;84(20):4041-4043.
(Continued)

*Primary Examiner* — Mohammad Islam
*Assistant Examiner* — Chi-Hua Yang
(74) *Attorney, Agent, or Firm* — Cermak Nakajima & McGowan LLP; Tomoko Nakajima (57) ABSTRACT A composite substrate 10 includes a sapphire body 1A, a seed crystal film 4 composed of gallium nitride crystal and provided on a surface of the sapphire body, and a gallium nitride crystal layer 7 grown on the seed crystal film 4 and having a thickness of 200 μm or smaller. Voids 5 are provided along an interface between the sapphire body 1A and the seed crystal film 4 in a void ratio of 4.5 to 12.5 percent.

9 Claims, 10 Drawing Sheets (51) Int. Cl.
- *H01L 33/00* (2010.01)
- *H01L 33/02* (2010.01)
- *H01L 33/22* (2010.01)
- *H01L 21/02* (2006.01)
- *C30B 19/02* (2006.01)
- *C30B 29/40* (2006.01)
- *C30B 33/06* (2006.01)

(52) U.S. Cl.
CPC ....... *H01L 21/0242* (2013.01); *H01L 21/0243* (2013.01); *H01L 21/0254* (2013.01); *H01L 21/0262* (2013.01); *H01L 21/02458* (2013.01); *H01L 33/007* (2013.01); *H01L 33/025* (2013.01); *H01L 33/22* (2013.01)

(56) References Cited

U.S. PATENT DOCUMENTS

| | | | |
|---|---|---|---|
| 2003/0219959 A1* | 11/2003 | Ghyselen et al. | 438/458 |
| 2004/0147096 A1* | 7/2004 | Kitaoka et al. | 438/483 |
| 2004/0262526 A1 | 12/2004 | Corbeil et al. | |
| 2007/0187693 A1* | 8/2007 | Kobayakawa et al. | 257/76 |
| 2010/0107969 A1* | 5/2010 | Kuraoka et al. | 117/68 |
| 2012/0025252 A1* | 2/2012 | Ichizono et al. | 257/98 |

FOREIGN PATENT DOCUMENTS

| | | |
|---|---|---|
| JP | 2005-281067 A | 10/2005 |
| JP | 2007-525652 A | 9/2007 |
| WO | WO2004/109870 A2 | 12/2004 |
| WO | WO2009/011407 A1 | 1/2009 |

OTHER PUBLICATIONS

International Search Report for PCT Patent App. No. PCT/JP2013/070264 (Sep. 3, 2013).

Office Action for Chinese Patent App. No. 2013 8000 1900.1 issued Nov. 2, 2015 with English language translation thereof.

* cited by examiner

COMPOSITE SUBSTRATES, A METHOD OF PRODUCING THE SAME, A METHOD OF PRODUCING FUNCTIONAL LAYERS MADE OF NITRIDES OF GROUP 13 ELEMENTS, AND FUNCTIONAL DEVICES

TECHNICAL FIELD OF THE INVENTION

The present invention relates to a composite substrate including a gallium nitride crystal layer, a method of producing the same, and a light emitting devices utilizing the same.

BACKGROUND ARTS

According to non-patent document 1 ("Applied Physics Letters" 84, page 4041), a thin layer of gallium nitride is grown on a sapphire body, and the gallium nitride layer and a surface of the sapphire body are then etched by $H_2$ annealing. The surface of the sapphire body is etched by the etching to form fine roughness thereon. By re-growing a gallium nitride thin layer on the roughened surface, it is possible to produce a seed crystal substrate including voids. However, the non-patent document 1 does not disclose Na flux method utilizing a gallium nitride seed crystal substrate.

Further, patent document 2 (Japanese Patent Publication No. 2000-327495A) discloses Na flux method of utilizing a seed crystal substrate of gallium nitride. In growing gallium nitride single crystal by Na flux method, by utilizing a substrate including deposited thin layer of gallium nitride (or AlN thin layer), it becomes possible to control the positions of nucleation and to facilitate the growth. However, according to the patent document 2, it is not described to peel GaN template from the thus grown gallium nitride layer.

According to patent document 3 (Japanese Patent Publication No. 2004-247711A), it is formed a gallium nitride layer with a layer including voids and a gallium nitride layer is then grown thereon by flux method so that a substrate and the grown nitride crystal are separated from each other in the vicinity of the voids.

According to patent document 4 (WO 2009-011407), a surface of a sapphire body is etched to produce a substrate including gallium nitride seed crystal with a layer including voids. A thick film of a gallium nitride crystal layer is then grown by flux method. During the subsequent fall of temperature, the sapphire body and gallium nitride are spontaneously peeled off from each other around the voids due to a difference of thermal expansion coefficients of sapphire and gallium nitride, so that a self-standing body of gallium nitride is obtained.

SUMMARY OF THE INVENTION

As described in Japanese Patent Publication No. 2000-327495A, the inventors had studied of utilizing a low-dislocation GaN template produced by Na flux method and of forming films of a structure by MOCVD realizing functions as LED or a power device method. The GaN template substrate means a substrate including a supporting body, a seed crystal film and a gallium nitride crystal layer (a thick film formed by flux method) provided thereon, so that it is provided a template for subsequently forming functional layers thereon.

In this case, according to the production methods described in the patent document 3 (Japanese Patent Publication No. 2004-247711A) and patent document 4 (WO 2009-011407), the gallium nitride crystal layer formed by Na flux method is spontaneously peeled off from the substrate and it cannot be provided a GaN template substrate, so that these methods had not been considered for providing the template.

Specifically, a gallium nitride crystal layer is formed on a sapphire body having a flat surface by MOCVD process or the like to provide a seed crystal substrate, and a gallium nitride crystal layer is then grown thereon by flux method at a temperature of 800 to 900° C. in a thickness of 10 to 200 μm, so that it could be produced a GaN template including the gallium nitride crystal layer having a low dislocation density at its uppermost surface.

The inventors tried to produce an LED structure by MOCVD method using this GaN template. At this time, however, fractures or cracks may be generated in the gallium nitride crystal layer of the GaN template in an atmosphere at a high temperature (1000° C. or higher) and are problematic.

An object of the present invention is, when a layer of a nitride of a Group 13 element is formed on a composite substrate including a sapphire body and a gallium nitride crystal layer grown on the sapphire body, to reduce cracks or fractures in the gallium nitride crystal layer.

The present invention provides a composite substrate comprising:
 a sapphire body;
 a seed crystal film provided on a surface of the sapphire body and comprising gallium nitride crystal; and
 a gallium nitride crystal layer grown on the seed crystal film and having a thickness of 200 μm or smaller;
 wherein voids are provided along an interface between the sapphire body and the seed crystal film at a void ratio of 4.5 to 12.5 percent.

The present invention further provides a method of producing a composite substrate comprising:
 a sapphire body; and
 a gallium nitride crystal layer grown on the sapphire body and having a thickness of 200 μm or smaller; the method comprising:
 an underlying film forming step of forming an underlying film comprising gallium nitride on the sapphire body by a vapor phase epitaxy process;
 an etching step of heating the sapphire body and the underlying film in the presence of hydrogen to remove the underlying film and roughen a surface of the sapphire body;
 a seed crystal film forming step of then forming a seed crystal film comprising a gallium nitride crystal on the surface of the sapphire body by a vapor phase epitaxy process; and
 a single crystal growing step of growing a gallium nitride crystal layer on the seed crystal film by flux method.

The invention further provides a method of producing a composite substrate comprising:
 a sapphire body; and
 a gallium nitride crystal layer grown on the sapphire body and having a thickness of 200 μm or smaller; the method comprising:
 a step of forming a light absorbing layer comprising a nitride of a Group 13 element on the sapphire body;
 a seed crystal film forming step of then forming a seed crystal film comprising a gallium nitride crystal on the light absorbing layer;
 a laser light irradiating step of irradiating a laser light onto the light absorbing layer to form voids; and
 a single crystal growing step of growing a gallium nitride crystal layer on the seed crystal film by flux method.

The present invention further provides a method of forming a functional layer comprising a nitride of a group 13 element on the gallium nitride crystal layer of the composite substrate by vapor phase epitaxy process.

The present invention further provides a composite substrate obtained by the method described above.

The present invention further provides a functional device comprising the composite substrate and a functional layer comprising a nitride of a Group 13 element and formed on the gallium nitride crystal layer by vapor phase epitaxy process.

The inventors studied the cause of the cracks and fractures generated in the gallium nitride layer in the case that a functional layer is further produced on the composite substrate by vapor phase epitaxy process, and thus reached the following speculation.

That is, the gallium nitride crystal layer is grown into a thick film at a growth temperature of 800 to 900° C. according to flux method. However, in the case that the functional layer is formed on the composite substrate by vapor phase epitaxy process such as MOCVD method or the like, the temperature was made 1000° C. or higher, and it was thus considered that it could not endure a stress between the sapphire body and the thick film of the gallium nitride crystal layer.

Then, the inventors applied roughening by etching or laser processing of a surface of a sapphire body to produce a GaN template with a void layer as a seed crystal layer. It was then tried to grow the gallium nitride crystal layer by flux method. Then, by controlling a void ratio at an interface between the seed crystal film and sapphire body, it was obtained a composite substrate whose gallium nitride crystal is not spontaneously peeled off from the sapphire body during the temperature descending step. Then, a functional layer is formed on the composite substrate by vapor phase epitaxy process, it was thus found that the cracks and fractures in the gallium nitride crystal layer described above could be prevented, and the present invention was thus made.

Here, by making the thickness of the gallium nitride crystal layer to 200 μm or smaller and the void ratio at the interface between the sapphire body and seed crystal film to 12.5 percent or lower, it becomes possible to prevent the peeling of the gallium nitride layer from the sapphire body. Further, by making the void ratio to 4.5 percent or higher, it becomes possible to prevent the cracks or fractures due to thermal stress between the sapphire body and gallium nitride crystal layer during the formation of the functional layer.

Besides, according to patent document 4, a surface of a sapphire body is etched to fine and roughened shape so as to produce a gallium nitride seed crustal substrate with a void layer therein, and a thick film of a gallium nitride crystal layer is grown by Na flux method thereon. Since the gallium nitride crystal layer forms a thick film, however, it is spontaneously peeled off from the sapphire body to provide a self-standing substrate. There had not been the idea of utilizing the composite substrate including the sapphire body as a template, and it could have not been reached the present invention.

MODES FOR CARRYING OUT THE INVENTION

The present invention will be described in detail below, with reference to the accompanying drawings.

Figure 1:
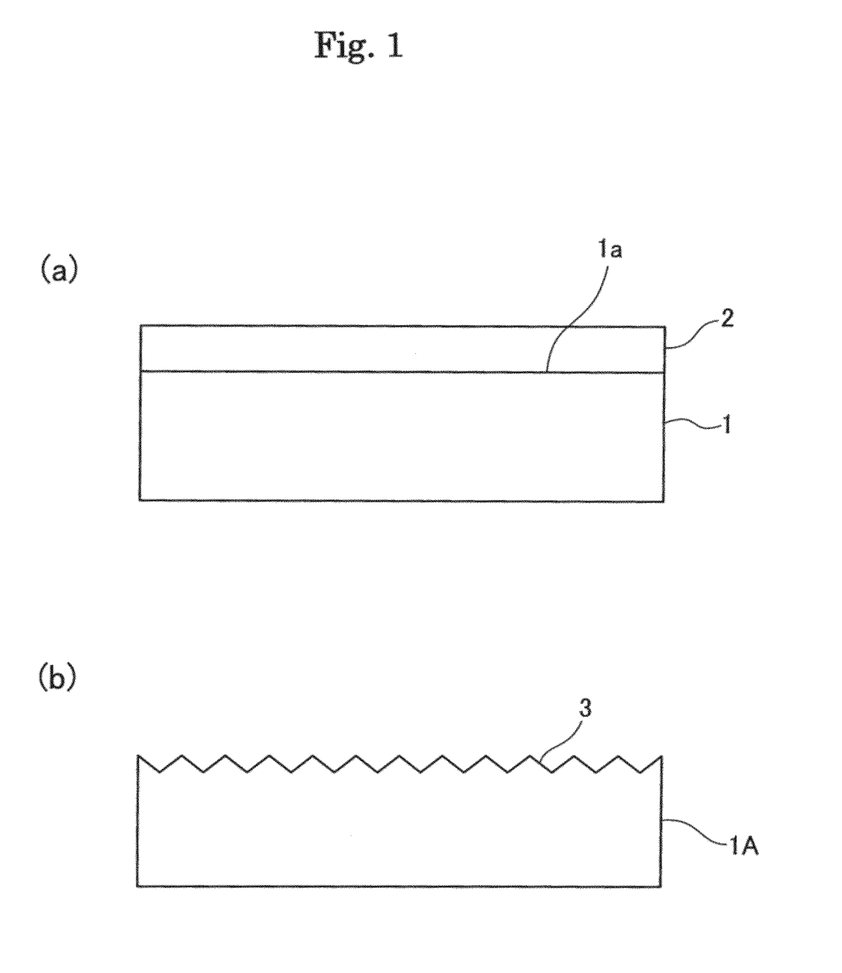
FIG. 1(a) is a cross-sectional view schematically illustrating a state of forming an underlying film 2 on a sapphire body 1.
FIG. 1(b) is a cross-sectional view schematically illustrating a sapphire body 1A whose surface is etched.

As illustrated in FIG. 1(a), an underlying film 2 composed of gallium nitride is formed on a surface 1a of a sapphire body 1. Next, by heating the body and the underlying film in the presence of hydrogen, the underlying film 2 is almost etched and removed, and a number of minute craters are generated on a surface of a substrate 1A to thereby form a roughened surface 3, as illustrated in FIG. 1(b).

Figure 2:
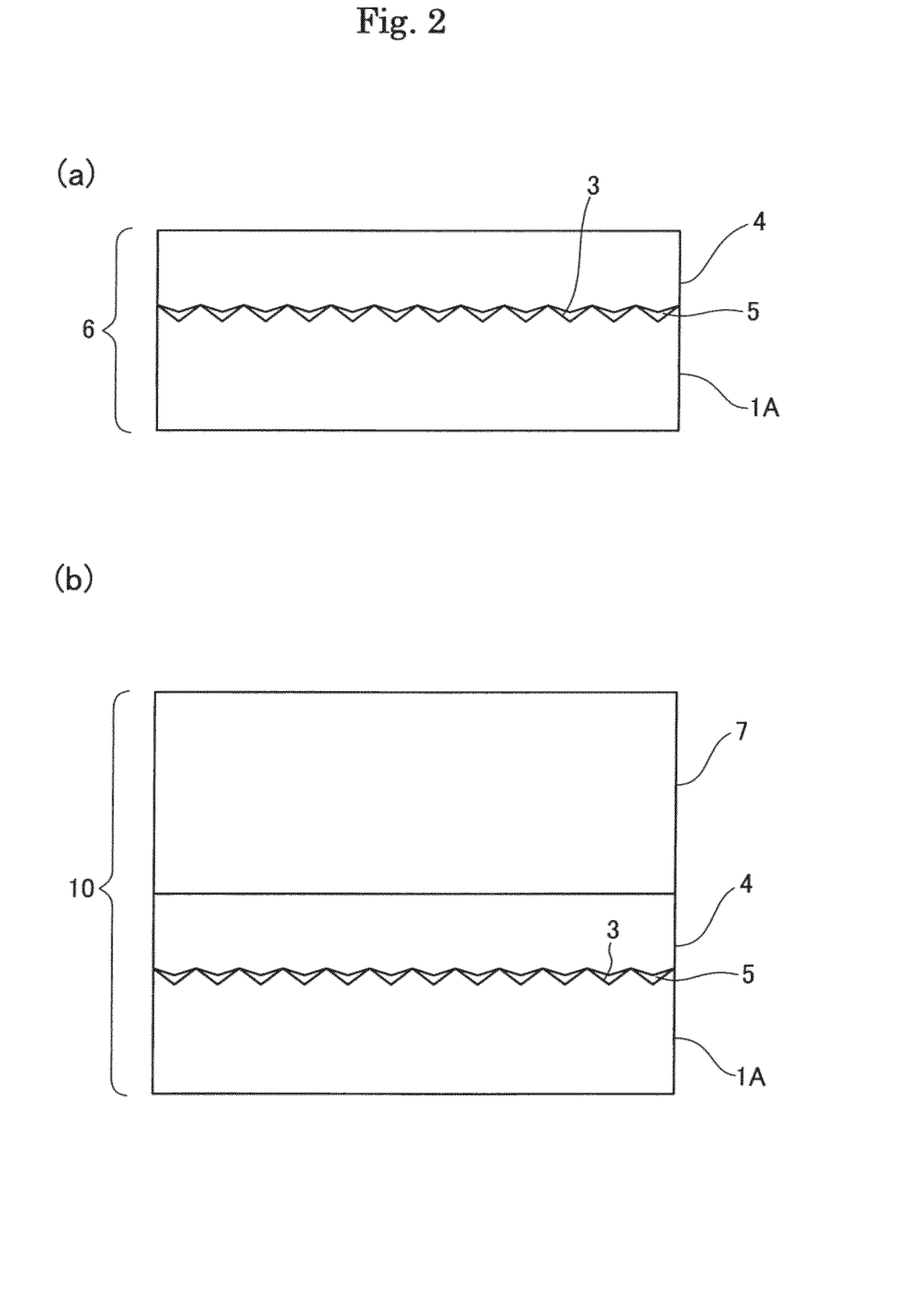
FIG. 2(a) is a cross sectional view schematically showing a state of forming a seed crystal film 4 on a roughened face 3 of a sapphire body 1.
FIG. 2(b) is a cross sectional view schematically showing a state of forming a gallium nitride crystal layer 7 on the seed crystal film 4 by flux method.

Then, as shown in FIG. 2(a), a seed crystal film 4 composed of a gallium nitride is formed on the roughened surface 3 of the body 1A. Within this seed crystal film 4, dislocation is suppressed by the influence of the roughened surface 3, thereby obtaining a seed crystal with excellent crystallinity. It is thereby possible to provide a seed crystal substrate 6.

Next, as shown in FIG. 2(b), a gallium nitride crystal layer 7 is epitaxially grown on the seed crystal film 4 by a flux method. At this time, the spontaneous peeling of the gallium nitride crystal layer 7 from the body 1A is prevented. It is thereby possible to obtain a composite substrate 10. As the gallium nitride crystal layer of the composite substrate 10 includes a small amount of dislocations, it can be used as a template for forming a functional layer by vapor phase epitaxy process thereon.

When the composite substrate is applied to a vapor phase epitaxy process, especially metal organic chemical vapor deposition process (MOCVD), it is found that cracks or fractures in the gallium nitride crystal layer can be prevented in an atmosphere at a high temperature (for example at a temperature exceeding 1000° C.).

Figure 3:
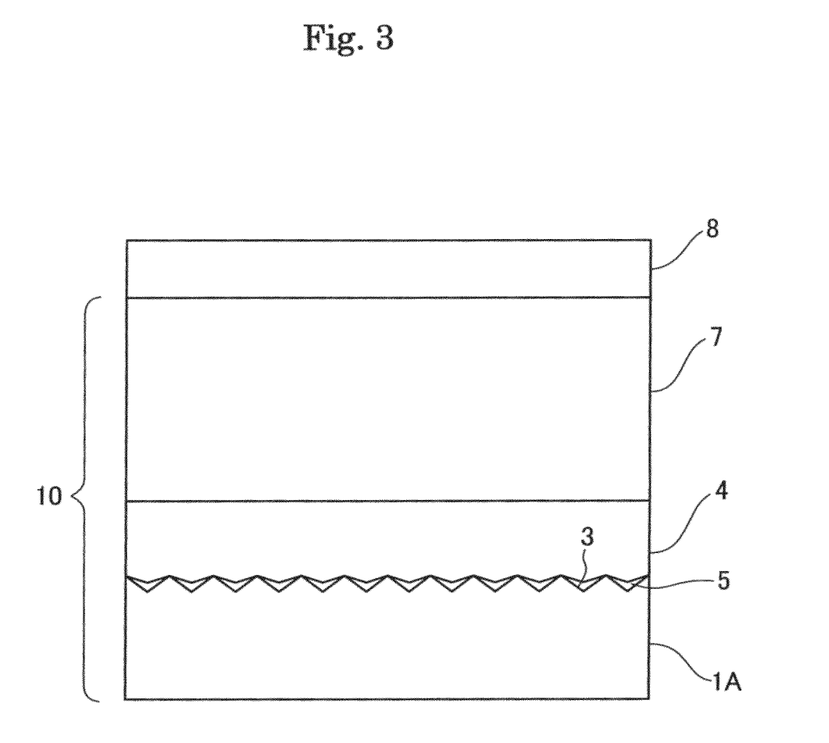
FIG. 3 is a cross sectional view schematically showing a state of forming a functional layer 8 on the gallium nitride crystal layer 7.
Figure 4:
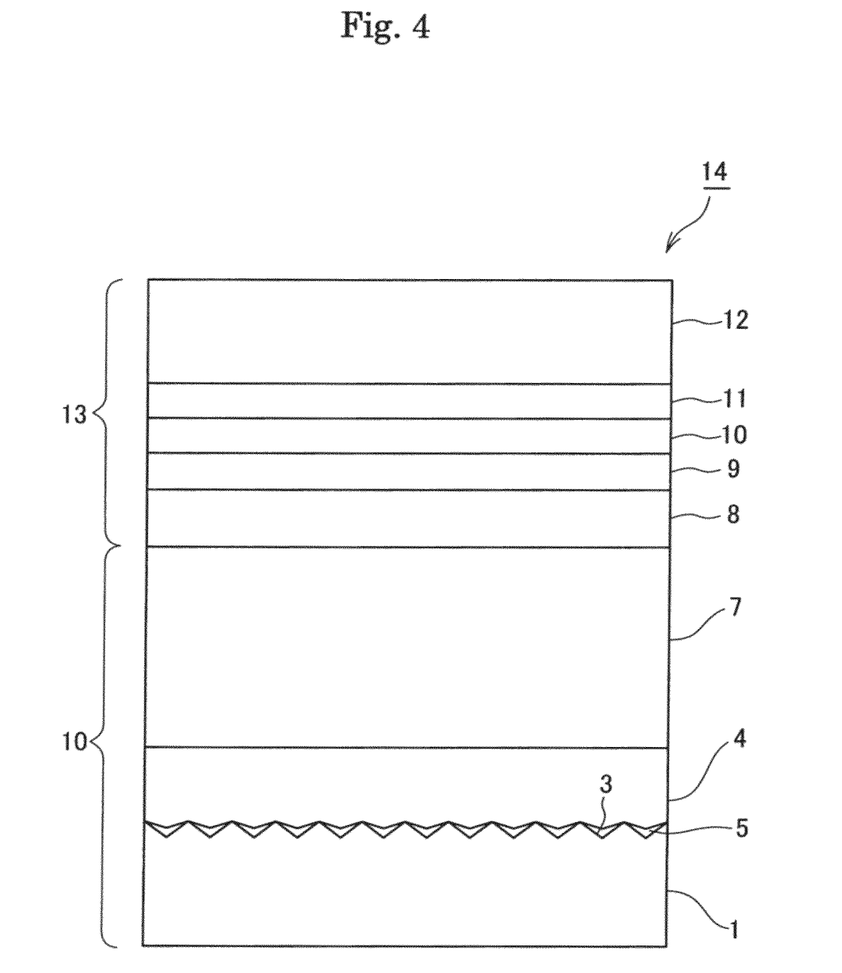
FIG. 4 is a cross sectional view of schematically showing a state of forming a light emitting structure 13 on the gallium nitride crystal layer 7.

Then, as shown in FIG. 3, a functional layer 8 is formed on the composite substrate 6. Here, a plurality of the functional layers may be formed. For example, a light emitting structure 13 is fabricated according to an example shown in FIG. 4. It is thus possible to provide a light emitting layer having a low dislocation density, so that an internal quantum efficiency of the light emitting device 14 is improved.

The light emitting device structure 13 includes, an n-type semiconductor layer, a light emitting region provided on the n-type semiconductor layer and a p-type semiconductor layer provided on the light emitting region, for example. According to the light emitting device 14 shown in FIG. 4, an n-type contact layer 8, an n-type clad layer 9, an activating layer 10, a p-type clad layer 11 and a p-type contact layer 12 are formed on the gallium nitride crystal layer 7 to constitute the light emitting structure 13.

Further, according to another preferred embodiment, it is provided a light absorbing layer composed of a nitride of a group 13 element on a sapphire body, a seed crystal film composed of gallium nitride is then formed on the light absorbing layer, and laser light is then irradiated onto the light absorbing layer to form voids. A gallium nitride crystal layer is then grown on the seed crystal layer by flux method.

According to this method, it is found that voids are formed along an interface between the sapphire body and the seed crystal film, and it can be produced a composite substrate whose void ratio is controlled depending on an intensity and positional control of laser processing.

(Sapphire Body)

Wurtzite structure of sapphire has c-plane, a-plane and m-plane. Each of these crystal faces is crystallographically defined. Growing directions of the underlying film, the seed crystal film and gallium nitride crystal layer grown by flux method may be the directions normal to the c-plane, the a-plane and the m-plane, respectively.

For reducing generation of the cracks, fractures, warping and peeling from the sapphire body of the gallium nitride crystal layer, the thickness of the gallium nitride crystal layer is preferably smaller than that of the sapphire body. Specifically, on the viewpoint of handling of the body, the thickness of the sapphire body may preferably be 200 to 2000 µm and more preferably be 300 µm or larger. Further, the thickness of the sapphire body may be made 1000 µm or smaller.

(Underlying Film)

A method of forming the underlying film is vapor phase epitaxy process. Examples of such a method include Metal Organic Chemical Vapor Deposition (MOCVD), Hydride Vapor Phase Epitaxy (HVPE), Molecular Beam Epitaxy (MBE) and sublimation.

Although the thickness of the underlying film is not particularly limited, the thickness may preferably be 0.01 µm or larger at which the etching effects of the roughening of the surface of the sapphire body becomes obtainable, may more preferably be 0.1 µm or larger, and still more preferably be 0.5 µm or larger. Further, when the thickness is too large, it takes a long time for completing the etching to result in a low efficiency, as well as the surface roughness due to the etching becomes too large so that the voids due to lateral growth are not generated during the formation of the seed crystal film. The thickness may thus preferably be 3.0 µm or smaller, more preferably be 2.0 µm or smaller and still more preferably be 1.5 µm or smaller.

The temperature of forming the underlying film may preferably be 1000° C. or larger and more preferably be 1050° C. or larger. Further, the temperature of forming the underlying film may preferably be 1160° C. or lower and more preferably be 1120° C. or lower.

(Roughening of Surface of Sapphire Body)

The etching of the surface of the sapphire body is performed under the condition that etching of the underlying film and the surface of the sapphire body is possible. Specifically, hydrogen is present in the atmosphere and heat treatment is performed. Any other gas except hydrogen may be or may not be contained in the atmosphere. When any other gas except hydrogen is contained in the atmosphere, the gas is preferably nitrogen, argon, helium or the like.

On the viewpoint of the present invention, the temperature during the etching for the roughening of the surface of the sapphire body may preferably be not lower than that of forming the underlying elm, and may preferably be 1260° C. or higher. It is thereby possible to appropriately control the void ratio along the interface between the sapphire body and seed crystal film, to generate the gallium nitride layer including a small amount of dislocations and to prevent the peeling of the gallium nitride crystal layer from the sapphire body. On the viewpoint, a difference between the temperature during the etching for the roughening of the surface of the sapphire body and the temperature of forming the underlying film may be 0° C. and may preferably be 80° C. or higher. Further, the temperature during the etching for the roughening of the surface of the sapphire body may preferably be 1100° C. or higher.

(Seed Crystal Film)

The seed crystal film may be composed of a single layer or may include a buffer layer on the side of the sapphire body. A method for forming the seed crystal film may preferably be vapor phase epitaxy process, for example, and examples of such a method include Metal Organic Chemical Vapor Deposition (MOCVD), Hydride Vapor Phase Epitaxy (HYPE), Pulse-Excited Deposition (PXD), Molecular Beam Epitaxy (MBE) and sublimation. Metal Organic Chemical Vapor Deposition is particularly preferred.

Further, voids 5 are formed along the interface between the sapphire body 1A and seed crystal film 4. In the case that the void ratio is high, however, the spontaneous peeling tends to occur during the growth of the gallium nitride crystal layer by flux method. Such spontaneous peeling is prevented by lowering the void ratio at some degree. On the other hand, in the case that the number of the voids is too low, cracks and fractures tend to occur due to thermal stress between the sapphire body and gallium nitride crystal layer during the formation of the functional layer. Therefore, the void ratio is preferably 4.5 to 12.5 percent.

(Growth of Gallium Nitride Crystal Layer by Flux Method)

According to the present invention, it is applied a seed crystal substrate 6 including a layer of fine voids. In the case that spontaneous peeling along the interface of the gallium nitride crystal layer 7 and sapphire body 1A occurs, however, it cannot be used as a composite substrate. Here, the thickness of the gallium nitride crystal layer is made 200 µm or smaller so that the spontaneous peeling of the gallium nitride crystal layer from the body 1A would be prevented. On the viewpoint, the thickness of the gallium nitride crystal layer 7 may preferably be 100 µm or smaller and more preferably be 50 µm or smaller.

Further, on the viewpoint of removing dislocations in the seed crystal film 4 during the growth of the gallium nitride by flux method and of making the crystallinity of the uppermost surface good, the thickness of the gallium nitride crystal layer 7 may preferably be 15 µm or larger and more preferably be 20 µm or larger.

Single crystal referred to in the present specification is defined as follows. Although single crystal includes typical single crystals where atoms are regularly arranged throughout the whole of the crystal, "single crystal" is not limited to such typical ones and includes those generally referred to in the Industries. That is, single crystal may include a some degree of defects, or may include internal stress, or may contain impurities in the crystal structure, and includes those called single crystal which is distinguishable from polycrystals (ceramics).

According to the present step, the gallium nitride crystal layer is grown by flux method. On this occasion, as long as the gallium nitride crystal can be generated, a type of the flux is not particularly limited. In a preferred embodiment, flux containing at least one of an alkaline metal and an alkaline-earth metal is used, and the flux containing sodium metal may be particularly preferably used.

As to the flux, a gallium raw material is mixed and used. As such gallium raw material, for example, gallium single metal, a gallium alloy or a gallium compound may be used. In terms of handling, gallium single metal may be used preferably.

The growth temperature of the gallium nitride crystal in the flux method and the holding time during the growth are not particularly limited, and they are appropriately changed in accordance with a composition of the flux. As an example, when the GaN single crystal is grown using a flux containing sodium or lithium, the growth temperature may be preferably set to 800° C. to 950° C., and more preferably set to 850 to 900° C.

By the flux method, a single crystal is grown in an atmosphere of nitrogen-containing gas. For this gas, nitrogen gas may be preferably used, and ammonia may be used. The total pressure of the atmosphere is not particularly limited; but it may be preferably set to 10 atm or more, and further preferably 30 atm or more, from the standpoint of prevention against the evaporation of the flux. However, as the pressure is high, an apparatus becomes large. Therefore, the total pressure of the atmosphere may be preferably set to 2000 atm or less, and further preferably 500 atm or less. Any other gas except the nitrogen-containing gas in the atmosphere is not limited; but an inert gas may be preferably used, and argon, helium, or neon may be particularly preferably used.

(Light Absorbing Layer)

A method of forming the light absorbing layer is vapor phase epitaxy process, and examples of such a method include Metal Organic Chemical Vapor Deposition (MOCVD), Hydride Vapor Phase Epitaxy (HYPE), Molecular Beam Epitaxy (MBE) and sublimation.

Although the thickness of the light absorbing layer is not particularly limited, on the viewpoint of facilitating the generation of the voids by laser light, the thickness may preferably be 15 nm or larger and more preferably be 30 nm or lager. Further, since the gallium nitride crystal layer would be susceptible to the peeling in the case that the light absorbing layer is too thick, the thickness may preferably be 300 nm or smaller and more preferably be 100 nm or smaller. Further, the material of the light absorbing layer is a nitride of a group 13 element as listed for a material of the functional layer as described later.

In the case that the voids are generated by using the laser light, although the thickness of the seed crystal film is not particularly limited, on the viewpoint of preventing the braking of the seed crystal film during the void generation, the thickness of the seed crystal film may preferably be 0.3 μm or larger. Further, on the viewpoint of facilitating the adjustment of focal point of the laser light, the warping of the sapphire body with the light absorbing layer and seed crystal film formed thereon may preferably be smaller. On the viewpoint of reducing the warping, the thickness of the seed crystal film at the time point of irradiating the laser light may preferably be 2 μm or smaller and more preferably be 1 μm or smaller. Considering an amount of melt-back caused by flux method, it is preferred to deposit a seed crystal film again by MOCVD process or the like after the formation of the voids so that a thickness of the thus deposited seed crystal film is increased.

(Laser Processing)

Although the kind of laser used for the laser processing is not particularly limited, the laser preferably has a wavelength whose optical absorbance by the light absorbing layer is high. As an example of such laser, it may be preferred an ultraviolet laser such as KrF excimer laser, ArF excimer laser, and fourth harmonic wave of YAG laser. $N_2$ gas is generated in the light absorbing layer due to breakdown of the gallium nitride crystal, it is preferred spot irradiation by using a pulse laser for preventing generation of the cracks and fractures. The irradiating size of the laser may preferably be 10 μm or smaller and more preferably be 3 μm or smaller.

(Functional Layer)

The functional layer is formed on the thus obtained composite substrate by vapor phase epitaxy process.

Such functional layer may be composed of a single layer or a plurality of layers. Further as the function, it may be used for a white LED with improved brightness and color rendering index, a blue-violet laser for high-speed and high-density optical memory, and a power device for an inverter for a hybrid car or the like.

In the case that a semiconductor light emitting diode (LED) is produced on the composite substrate by vapor phase epitaxy process, preferably organic metal chemical vapor deposition (MOCVD) method, the dislocation density inside of the LED becomes comparable with that of the GaN template.

The temperature of forming the functional layer may preferably be 950° C. or higher and more preferably be 1000° C. or higher, on the viewpoint of crystal quality. Further, on the viewpoint of preventing the cracks and fractures in the gallium nitride crystal layer, the temperature of forming the functional layer may preferably be 1200° C. or lower and more preferably be 1150° C. or lower.

The material of the functional layer may preferably be a nitride of a group 13 element. Group 13 element means group 13 element according to the Periodic Table determined by IUPAC. The group 13 element is specifically gallium, aluminum, indium, thallium or the like. Further, as an additive, it may be listed carbon, a metal having a low melting point (tin, bismuth, silver, gold), and a metal having a high melting point (a transition metal such as iron, manganese, titanium, chromium). The metal having a low melting point may be added for preventing oxidation of sodium, and a metal having a high melting point may be incorporated from a container for containing a crucible, a heater of a growing furnace or the like.

EXAMPLES

Example 1

Production of Seed Crystal Substrate

A c-plane sapphire single crystal body 1 with a diameter of 4 inches and a thickness of 630 μm was put in an MOCVD furnace (metal organic chemical vapor deposition furnace), and heated at 1150° C. for 10 minutes in hydrogen atmosphere to perform the cleaning of the surface of the body. Then, the temperature of the body was lowered to 500° C., and the gallium nitride film was grown to a thickness of 30 nm using TMG (trimethyl gallium) and ammonia as raw materials. Next, the temperature of the body was raised up to 1100° C., and gallium nitride layer was grown to a thickness of 1 μm using TMG and ammonia as raw materials to form the underlying film 2.

The supply of TMG and ammonia was then terminated, and the surface gallium nitride layer was almost evaporated in atmosphere of hydrogen alone to expose the sapphire body 1A. The temperature of the body was made higher than that for forming the gallium nitride layer. As the conditions for evaporating the underlying film made of gallium nitride from the surface of the sapphire body, five kinds of temperatures were applied so that it was tested, in advance, a time period required for the gallium nitride layer to substantially disappear using a system for optically measuring a film thickness equipped with the MOCVD furnace (refer to the conditions A to E described in table 1).

Under the conditions A to E shown in table 1, the gallium nitride as well as the surface region of the sapphire body were evaporated to confirm that fine roughness was introduced. Under the condition F shown in table 1, this step was omitted, the surface of the sapphire body was not etched, and the subsequent steps were performed.

Using TMG and ammonia as raw materials as well as hydrogen gas and nitrogen gas as carrier gases, the seed crystal film composed of gallium nitride was grown again on the body at a temperature of 1100° C. and deposited to a thickness of 5 μm.

The seed crystal substrates produced under the conditions A to F were drawn out of the MOCVD furnace, the respective substrates were cleaved and the cross sectional face of the sapphire body and the seed crystal film thereon were observed (FIGS. 5 to 10) using a scanning type electron microscope (SEM). "JSM-5410" supplied by JEOL Ltd. was used as the SEM system. The cross section was measured at a magnitude of 3500, it was measured a length of a void with respect to an interface having a length of 38 μm in a visual field, and the void ratio was calculated and shown in table 1. As shown in table 1, the ratio of void generation was proved to be changed depending on the heating temperature and time during the evaporation. Further, a number of spots (dark spots), which are darker than the surrounding regions due to weaker luminescence by cathode luminescence (CL) method, was counted as dislocations appearing on the surface of the substrate, so that the dislocation densities of the seed crystal films under the respective conditions were calculated. For the measurement by CL method, it was used "S-3400N Type II" supplied by Hitachi High-Technologies Corporation equipped with a detector of observing cathode luminescence. The results were shown in table 1.

TABLE 1

Figure 5:
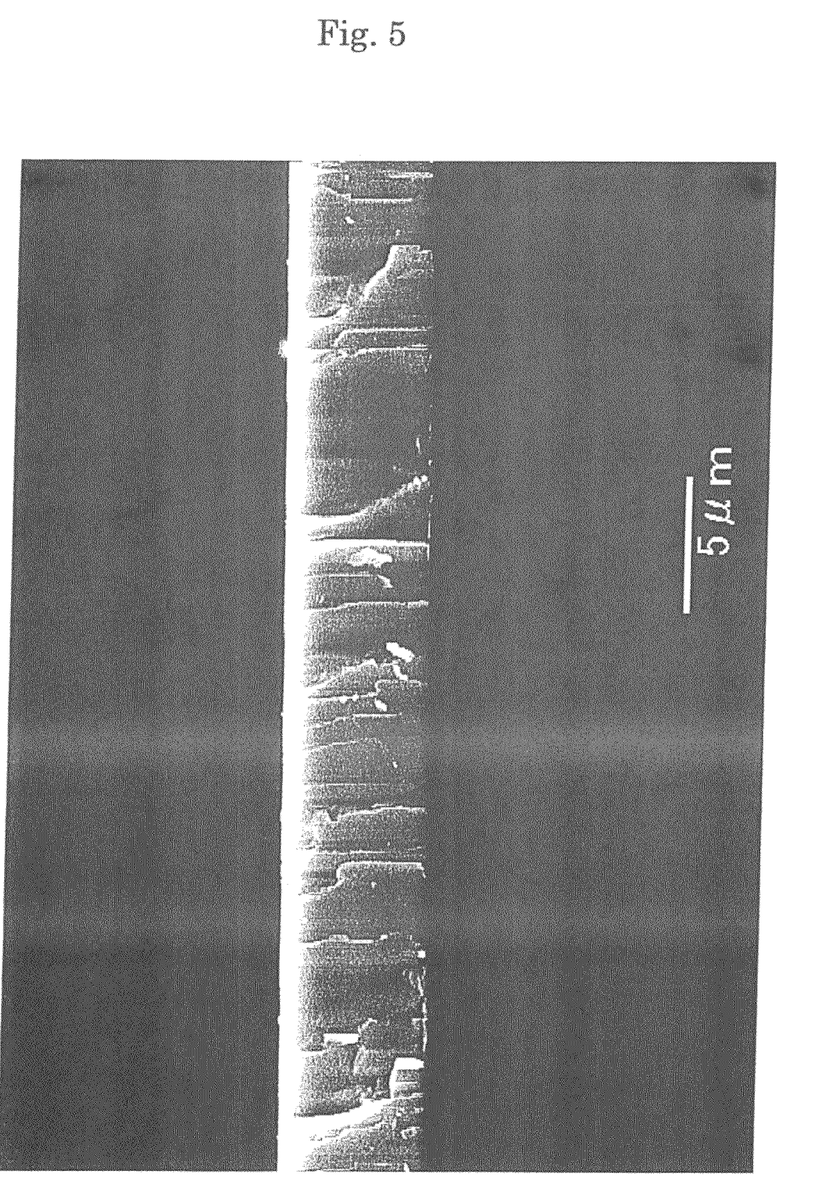
FIG. 5 is a photograph taken by a scanning type electron microscope showing microstructure near an interface between the sapphire body and the seed crystal film obtained by condition A.
Figure 6:
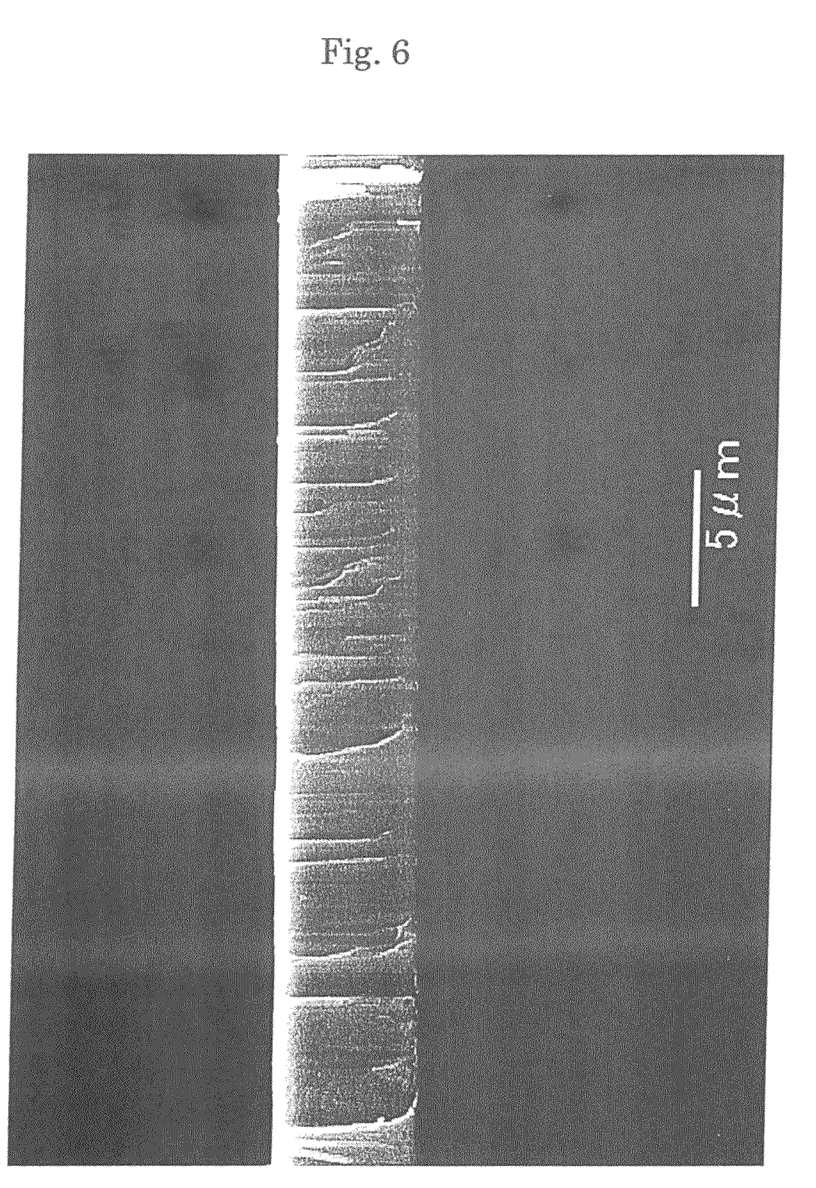
FIG. 6 is a photograph taken by a scanning type electron microscope showing microstructure near an interface between the sapphire body and the seed crystal film obtained by condition B.
Figure 7:
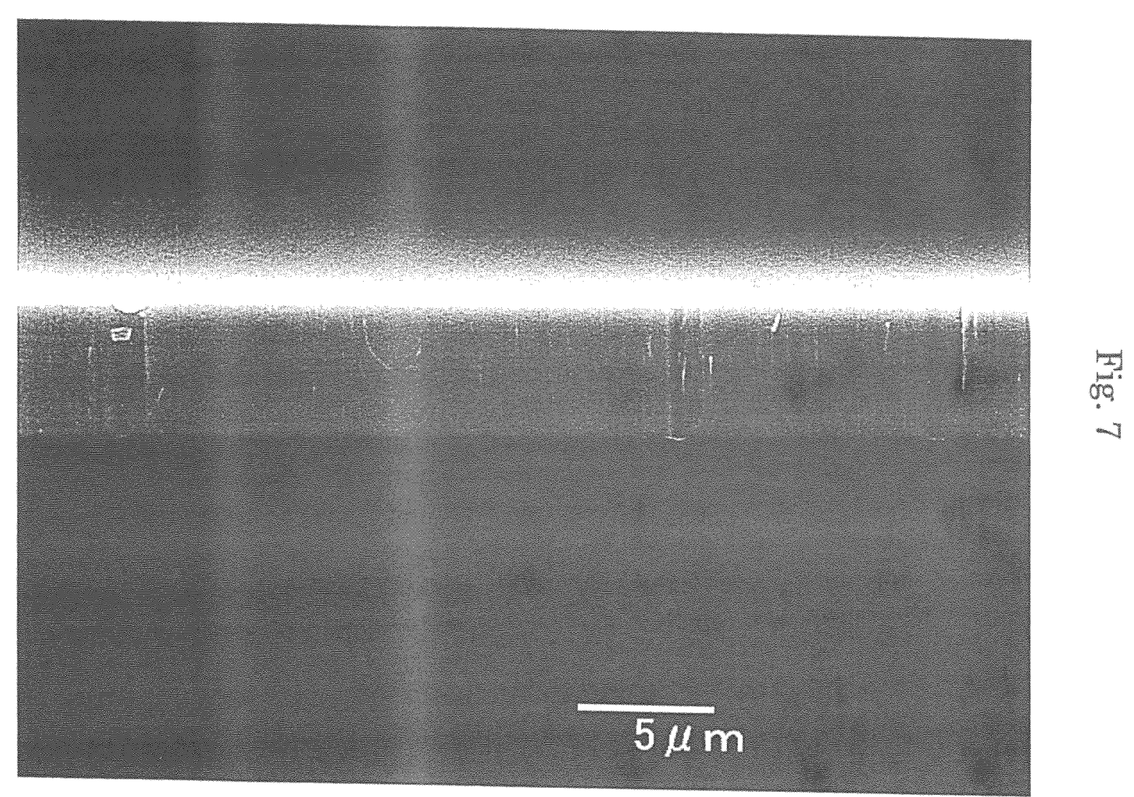
FIG. 7 is a photograph taken by a scanning type electron microscope showing microstructure near an interface between the sapphire body and the seed crystal film obtained by condition C.
Figure 8:
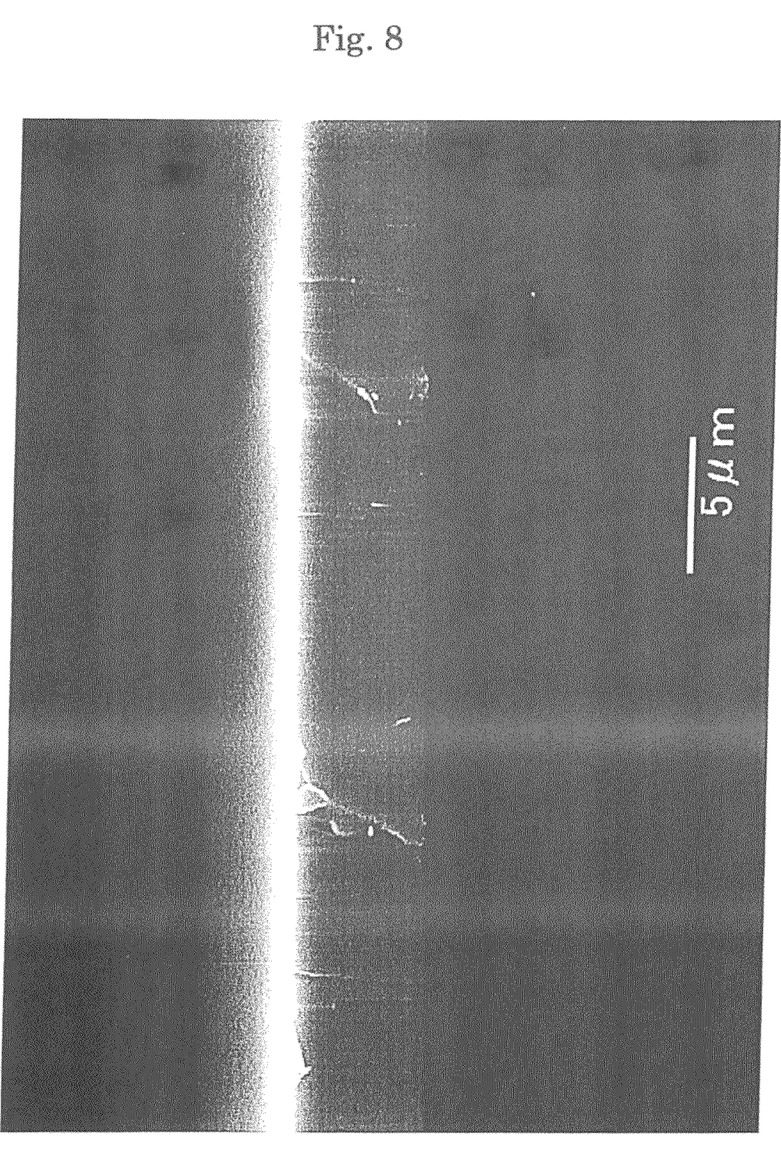
FIG. 8 is a photograph taken by a scanning type electron microscope showing microstructure near an interface between the sapphire body and the seed crystal film obtained by condition D.
Figure 9:
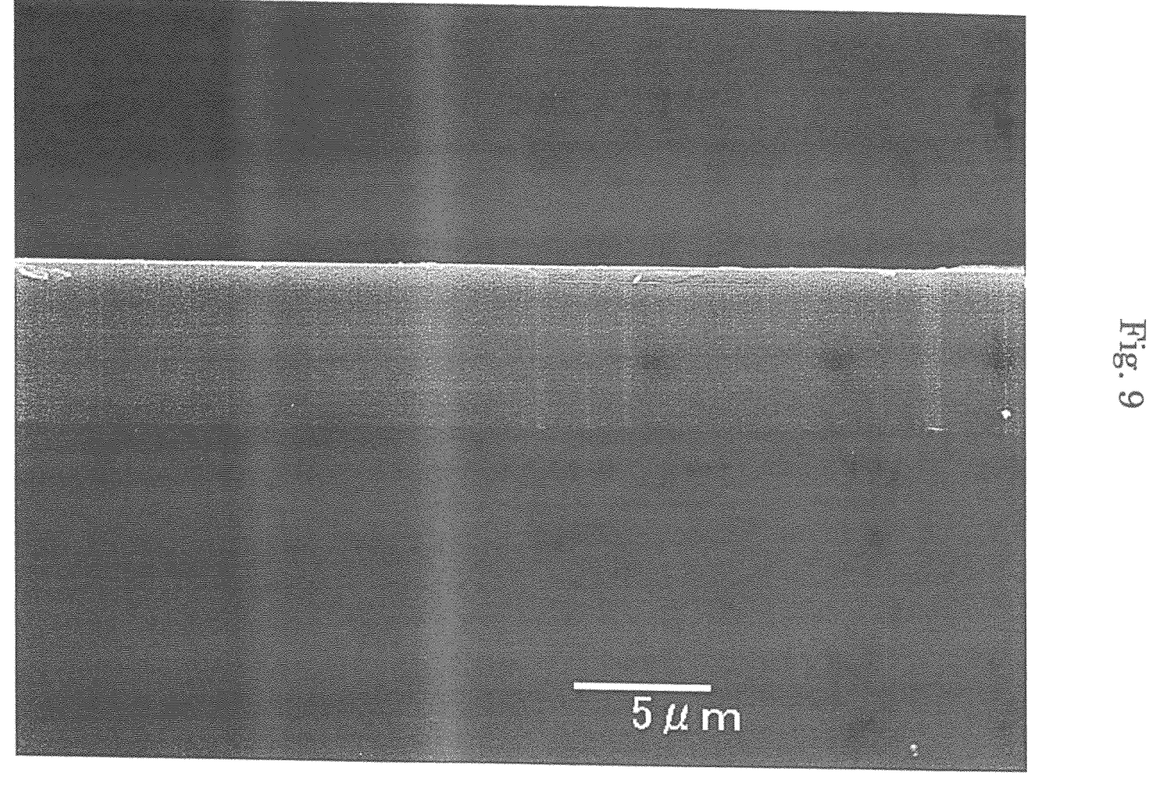
FIG. 9 is a photograph taken by a scanning type electron microscope showing microstructure near an interface between the sapphire body and the seed crystal film obtained by condition E.
Figure 10:
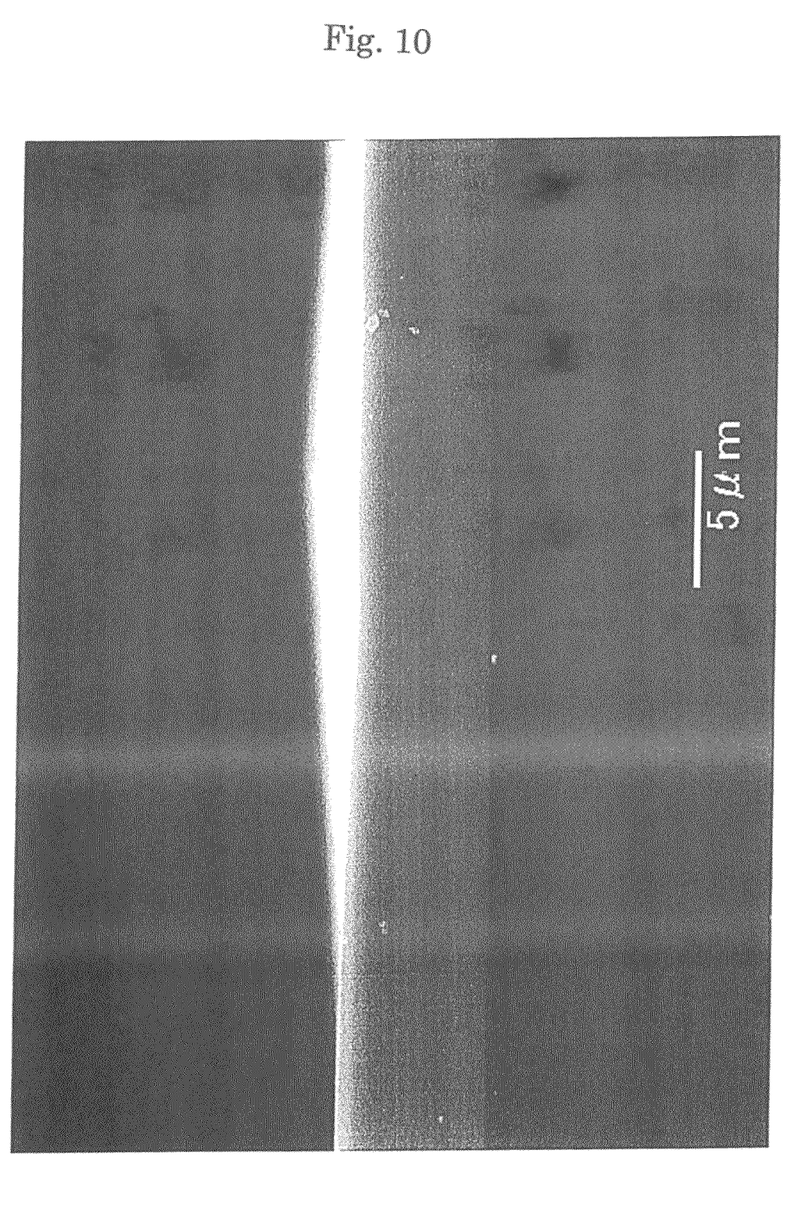
FIG. 10 is a photograph taken by a scanning type electron microscope showing microstructure near an interface between the sapphire body and the seed crystal film obtained by condition F.

| | Heating Temperature (° C.) | Heating time [sec.] | SEM Image | Void Ratio (%) | Dislocation Density Of seed Crystal film [counts/cm$^2$] (by CL method) |
|---|---|---|---|---|---|
| Condition A | 1180 | 500 | FIG. 5 | 12.9 | $2 \times 10^9$ |
| Condition B | 1200 | 400 | FIG. 6 | 12.5 | $2 \times 10^9$ |
| Condition C | 1240 | 200 | FIG. 7 | 8.2 | $2 \times 10^9$ |
| Condition D | 1260 | 100 | FIG. 8 | 4.5 | $2 \times 10^9$ |
| Condition E | 1280 | 80 | FIG. 9 | 4.3 | $4 \times 10^9$ |
| Condition F | Not Heated | Not Heated | FIG. 10 | 0.0 | $7 \times 10^9$ |

(Flux Method)

Gallium nitride crystal was grown by Na flux method using the respective substrates produced under the six conditions as seed crystal substrates. Raw materials used for the growth are gallium metal, sodium metal and lithium metal. 30 g of gallium metal, 44 g of sodium metal and 30 mg of lithium metal were filled in an alumina crucible, respectively, and the GaN single crystal was grown for about 30 hours at an in-furnace temperature of 900° C. and at a pressure of 5 MPa. As a result of taking out the GaN single crystal from the crucible, transparent single crystal of gallium nitride was deposited to a thickness of 300 μm on the surfaces of the substrates obtained under the conditions B to F. Under the condition A, the gallium nitride layer was disappeared and the surface of the sapphire body was exposed. The reason is considered to be that the gallium nitride layer is spontaneously peeled off from the sapphire body during the process of forming the gallium nitride layer by flux method.

(Evaluation)

Five kinds of samples obtained under the conditions B to F, excluding the condition A, were made flat by polishing with diamond abrasives to obtain c-face GaN templates (composite substrates) each having a diameter of 4 inches and the gallium nitride layer of a thickness of 70 μm. As a result of measuring the dislocation density of the gallium nitride layer on the surface of the GaN template by CL method, it was proved to be about $10^6$ to $10^7$ counts/cm$^2$, so that it was confirmed the effect of further reducing the dislocations compared with the seed crystal substrate (such substrate is called "low dislocation GaN template").

(Film Formation on the Low Dislocation GaN Template by MOCVD Method)

Each of the five low dislocation GaN templates according to the conditions B to F was contained in a MOCVD furnace, the temperature was elevated to 1100° C. in an atmosphere of mixture of hydrogen and ammonia gases, an insulating ud-GaN layer was grown at the temperature to a thickness of 2 μm using TMG and ammonia as raw materials, and monosilane was then mixed into the raw material gases so that an n-GaN layer was grown to a thickness of 2 μm. Thereafter, the supply of the raw materials was terminated, the temperature of the substrate was cooled to room temperature and the substrate was then drawn out.

According the conditions B to F, the gallium nitride crystal layer was not peeled off from the sapphire body. A flat surface was obtained according to the conditions B, C and D. On the other hand, cracks were generated on the surface of the gallium nitride layer according to the conditions E and F.

Hall effect was measured for the n-GaN layer formed on each of the low dislocation GaN templates as a test of the electrical property. Each of the samples produced under the five kinds of conditions B to F were cut out in 6 mm square, Ti/Al electrodes of 1 mm square were deposited on the four corners, the sample was then annealed at 600° C. in nitrogen atmosphere for 1 minute, the temperature was lowered to room temperature and the sample was then drawn out to produce samples for measurement. It was confirmed that an ohmic resistance was obtained between the Ti/Al electrode and n-GaN layer, and the Hall measurement was then performed by applying Van Der Pauw method. As a result, according the conditions E and F, anisotropy was observed between the electrodes due to the generation of cracks and the measurement results were defective.

According to the conditions B, C and D, anisotropy was not observed, the measurement results were good, and it was obtained a carrier density N of $1 \times 10^{17}$ cm$^{-3}$ and a mobility μ of 700 cm$^2$/Vs according to each condition. As can be seen from the above, it is possible to prevent the cracks in the gallium nitride layer or fractures of the sapphire body in the case that the void ratio is 4.5 to 12.5 percent.

It was measured a dislocation density of the surface of the n-GaN layer formed on the low dislocation GaN template by CL method, and it was proved to be about $10^6$ to $10^7$ counts/$cm^2$, which was comparable with that of the low dislocation density GaN template.

Experiment 2

Production of Seed Crystal Substrate

A c-plane sapphire single crystal body 1 with a diameter of 4 inches and a thickness of 630 μm was put in an MOCVD furnace (metal organic chemical vapor deposition furnace), and heated at 1200° C. for 10 minutes in hydrogen atmosphere to perform the cleaning of the surface of the sapphire body. Then, the temperature of the body was lowered to 500° C., and the gallium nitride layer was grown to a thickness of 30 nm using TMG (trimethyl gallium) and ammonia as raw materials. Next, the temperature of the body was raised up to 1100° C., and a gallium nitride layer was grown to a thickness of 2 μm using TMG and ammonia as raw materials to form the underlying film 2.

The supply of TMG and ammonia was then terminated, and the surface gallium nitride layer was almost evaporated under atmosphere of hydrogen only to expose the sapphire body 1A. As the conditions for evaporating the underlying film 2 made of gallium nitride from the surface of the sapphire body, five kinds of temperatures were applied so that it was tested, in advance, a time period required for the gallium nitride layer to substantially disappear using a system for optically measuring a film thickness equipped with the MOCVD furnace (refer to the conditions G to K described in table 2).

Under the conditions G to K shown in table 2, the gallium nitride as well as the surface region of the sapphire body were etched and evaporated to confirm that fine roughness was introduced.

Using TMG and ammonia as raw materials as well as hydrogen gas and nitrogen gas as carrier gases, the seed crystal film composed of gallium nitride was grown again on the body at a temperature of 1100° C. and deposited to a thickness of 5 μm.

The seed crystal substrates produced under the conditions "G" to "K" were drawn out of the MOCVD furnace, the respective substrates were cleaved and the cross sectional face of the sapphire body and the seed crystal film thereon were observed using the scanning type electron microscope (SEM), as described in the Experiment 1. It was measured a length of a void and the void ratio was calculated and shown in table 2. As shown in table 2, the ratio of void generation was proved to be changed depending on the heating temperature and time during the evaporation. Further, the dislocation density of the seed crystal film was calculated according to the CL method. The results were shown in table 2.

TABLE 2

| | Heating Temperature (° C.) | Heating Time [second] | Void Ratio (%) | Dislocation Density of seed crystal film [counts/$cm^2$] (by CL method) |
|---|---|---|---|---|
| Condition G | 1080 | 3600 | 12.7 | $3 \times 10^8$ |
| Condition H | 1100 | 2400 | 11.8 | $4 \times 10^8$ |
| Condition I | 1180 | 1100 | 10.2 | $7 \times 10^8$ |
| Condition J | 1260 | 210 | 4.7 | $2 \times 10^9$ |
| Condition K | 1275 | 180 | 4.4 | $3 \times 10^9$ |

(Flux Method)

Gallium nitride crystal was grown by Na flux method using the respective substrates produced under the five conditions as seed crystal substrates. Raw materials used for the growth were gallium metal, sodium metal and lithium metal. 30 g of gallium metal, 44 g of sodium metal and 30 mg of lithium metal were filled in an alumina crucible, respectively, and the gallium nitride single crystal was grown for about 30 hours at an in-furnace temperature of 900° C. and at a pressure of 5 MPa. As a result of taking out the GaN single crystal from the crucible, transparent gallium nitride single crystal was deposited to a thickness of about 300 μm on the surface of the bodies obtained under the conditions G to K. Under the condition G, the gallium nitride layer was disappeared and the surface of the sapphire body was exposed. The reason is considered to be that the gallium nitride layer is spontaneously peeled off from the sapphire body during the process of forming the gallium nitride layer by flux method.

(Evaluation)

Four kinds of samples obtained under the conditions H to K, excluding the condition G, were made flat by polishing with diamond abrasives to obtain c-face GaN templates (composite substrates) each having a diameter of 4 inches and the gallium nitride layer of a thickness of 70 μm. As a result of measuring the dislocation density of the gallium nitride layer on the surface of the GaN template by CL method, it was proved to be about $10^6$ to $10^7/cm^2$, so that it was confirm, the effect of further reducing the dislocations compared with the seed crystal substrate (such substrate is called "low dislocation GaN template").

(Film Formation on the Low Dislocation GaN Template by MOCVD Method)

Each of the four low dislocation GaN templates according to the conditions H to K was contained in a MOCVD furnace, the temperature was elevated to 1100° C. in an atmosphere of mixture of hydrogen and ammonia gases, an insulating ud-GaN layer was grown at the temperature to a thickness of 2 μm using TMG and ammonia as raw materials, and monosilane was then mixed into the raw material gases so that an n-GaN layer was grown to a thickness of 2 μm. Thereafter, the supply of the raw materials was terminated, the temperature of the substrate was cooled to room temperature and the substrate was then drawn out.

According the conditions H to K, the gallium nitride crystal layers were not peeled off from the sapphire body. A flat surface was obtained according to the conditions H, I and J. On the other hand, cracks were generated on the surface of the gallium nitride layer according to the condition K.

Hall effect was measured for the n-GaN layer formed on each of the low dislocation GaN templates as a test of electrical property. Each of the samples produced under the four kinds of conditions H to K was cut out into 6 mm square, Ti/Al electrodes of 1 mm square were deposited on the four corners, the sample was then annealed at 600° C. for 1 minute, the temperature was lowered to room temperature and the sample was then drawn out to produce the samples for measurement. It was confirmed that an ohmic resistance was obtained between the Ti/Al electrode and n-GaN layer, and the Hall measurement was then performed by applying Van Der Pauw method. As a result, according the condition K, anisotropy was observed between the electrodes due to the generation of cracks and the measurement result was defective.

According to the conditions H, I and J, anisotropy was not observed, the measurement results were good, and it was obtained a carrier density N of $1 \times 10^{17}$ $cm^{-1}$ and a mobility μ of 700 $cm^2$/Vs according to each condition. As can be seen from the above, it is possible to prevent the cracks in the gallium nitride layer or fractures of the sapphire body in the case that the void ratio is 4.5 to 12.5 percent, as the Example 1.

It was measured a dislocation density of the surface of the n-GaN layer formed on the low dislocation GaN template by CL method, and it was proved to be about $10^6$ to $10^7$ counts/$cm^2$, which was comparable with that of the low dislocation density GaN template.

Experiment 3

Production of Seed Crystal Substrate

A c-plane sapphire single crystal body 1 with a diameter of 4 inches and a thickness of 630 μm was put in an MOCVD furnace (metal organic chemical vapor deposition furnace), and heated at 1150° C. for 10 minutes in hydrogen atmosphere to perform the cleaning of the surface of the body. Then, the temperature of the body was lowered to 500° C., and a gallium nitride layer, as the light absorbing layer, was grown to a thickness of 30 nm using TMG (trimethyl gallium) and ammonia as raw materials. Next, the temperature of the body was raised up to 1100° C., and a gallium nitride layer was grown to a thickness of 1 μm using TMG (trimethyl gallium) and ammonia as raw materials to form the seed crystal film, and the thus obtained substrate was drawn out of the MOCVD furnace. Six seed crystal substrates were produced according to the same procedure. The warping of the sapphire body with the seed crystal film formed thereon was measured to prove that the body had a convex shape with the seed crystal film oriented upwardly and the warping was 15 μm in all the bodies.

Pulses of KrF excimer laser light were irradiated to the sapphire body with the thus formed seed crystal film from the side of the sapphire body. As a result, the light absorbing layer absorbed the laser light so that the gallium nitride was decomposed to form voids each having a size of 1 μm. The laser light was irradiated in six-fold symmetry at a predetermined interval to try the production of the seed crystal substrate with the voids formed in the light absorbing layer. As to the pitch of the voids, it was produced the seed crystal substrate with the voids formed according to each of the conditions A' to F' shown in table 3. Besides, fractures or roughness were not generated on the surfaces of the seed crystal films.

The sapphire bodies with the seed crystal films produced under the conditions A' to F' were contained in the MOCVD furnace again, respectively, and the temperature of the sapphire bodies was elevated to 1100° C. while flowing nitrogen gas. The supply of the nitrogen gas was terminated and TMG (trimethyl gallium) and ammonia were used as raw materials to grow a gallium nitride crystal layer to a thickness of 5 μm to produce seed crystal substrates, bile flowing hydrogen gas. The substrates were drawn out of the MOCVD furnace. The dislocation densities on the surface of the seed crystal films were measured by CL method and they were proved to be about $7 \times 10^9$ counts/$cm^2$.

Gallium nitride single crystal was deposited on each of the thus obtained substrates according to the same procedure as the Example 1 by flux method to prove that transparent gallium nitride single crystal was deposited to a thickness of about 300 μm on the surface of each substrates obtained under the conditions B' to F'. Under the condition A', the gallium nitride layer was disappeared and the surface of the sapphire body was exposed. The reason is considered to be that the gallium nitride layer is spontaneously peeled off from the sapphire body during the process of forming the gallium nitride layer by flux method.

Five kinds of samples obtained under the conditions B' to F', excluding the condition A', were made flat by polishing with diamond abrasives to obtain c-face GaN templates (composite substrates) each having a diameter of 4 inches and the gallium nitride layer of a thickness of 70 μm. As a result of measuring the dislocation density of the GaN template by CL method, it was proved to be about $10^6$ to $10^7$ counts/$cm^2$, so that it was confirm the effect of further reducing the dislocations compared with the seed crystal substrate (such substrate is called "low dislocation GaN template").

Each of the five low dislocation GaN templates according to the conditions B' to F' was contained in a MOCVD furnace, the temperature was elevated to 1100° C. in an atmosphere of mixture of hydrogen and ammonia gases, an insulating ud-GaN layer was grown at the temperature to a thickness of 2 μm using TMG and ammonia as raw materials, and monosilane was then mixed into the raw material gases so that an n-GaN layer was grown to a thickness of 2 μm. Thereafter, the supply of the raw materials was terminated, the temperature of the substrate was cooled to room temperature and the substrate was then drawn out.

According to the conditions B' to F', the gallium nitride layer was not peeled off from the sapphire body. According to the conditions B', C', D' and E', a flat surface was obtained. On the other hand, according to the condition F', cracks were observed on the surface of the gallium nitride layer.

According to the conditions B', C', D' and E', uniform layers could be formed and it was attained a carrier density N of $1 \times 10^{17}$ $cm^{-3}$ and a mobility μ of 650 $cm^2$/Vs according to each condition. As can be seen from the above, it is possible to prevent the cracks in the gallium nitride layer or fractures of the sapphire body in the case that the void ratio is 4.5 to 12.5 percent.

It was measured a dislocation density of the surface of the low dislocation gallium nitride single crystal substrate by CL method, and it was proved to be about $10^6$ to $10^7$ counts/$cm^2$, which was comparable with that of the low dislocation density GaN template.

TABLE 3

|  | Void size [μm] | Distance [μm] | Void Ratio (%) | Dislocation Density of seed crystal film [counts/$cm^2$] (by CL method) |
| --- | --- | --- | --- | --- |
| Condition A' | 1 | 7 | 14.3 | $7 \times 10^9$ |
| Condition B' | 1 | 8 | 12.5 | $7 \times 10^9$ |
| Condition C' | 1 | 10 | 8.2 | $7 \times 10^9$ |
| Condition D' | 1 | 20 | 5.0 | $7 \times 10^9$ |
| Condition E' | 1 | 22 | 4.5 | $7 \times 10^9$ |
| Condition F' | 1 | 25 | 4.0 | $7 \times 10^9$ |

Experiment 4

First, seed crystal substrates were produced according to the procedure as the condition C in the experiment 1. Gallium nitride crystal was then grown on the seed crystal substrate according to the same procedure as the Experiment 1 by Na flux method. Transparent gallium nitride single crystal was deposited to a thickness of about 300 μm.

Then, the surface of the transparent gallium nitride single crystal was made flat by polishing using diamond abrasives. The thickness of the gallium nitride layer was, however, variously changed as shown in table 4 to obtain the respective composite substrates.

An n-GaN layer was grown on each of the composite substrates to a thickness of 2 μm according to the same procedure as the Experiment 1. Thereafter, the supply of the raw materials was terminated, the temperature of the substrate was lowered to room temperature and the substrate was drawn out.

As to the thus obtained substrates, the presence or absence of cracks, carrier density, mobility and dislocation density on the surface of the n-GaN layer were measured. The results were shown in table 4.

TABLE 4

| Condition | Thickness Of Gallium Nitride layer (μm) | Cracks On Surface | Carrier Density N (cm$^{-3}$) | Mobility μ (cm$^2$/Vs) | Dislocation Density On surface Of GaN layer counts/cm$^2$ |
|---|---|---|---|---|---|
| C | 70 | Absent | $1 \times 10^{17}$ | 700 | $2 \times 10^6$ |
| P | 200 | Absent | $1 \times 10^{17}$ | 750 | $1 \times 10^6$ |
| Q | 50 | Absent | $1 \times 10^{17}$ | 680 | $4 \times 10^6$ |
| R | 20 | Absent | $1 \times 10^{17}$ | 630 | $8 \times 10^6$ |
| S | 250 | Present | Not Measurable | Not Measurable | Not Measurable |

APPLICATIONS

The present invention may be used in applications requiring high quality, such as a white LED with improved color rendering index and called a post-fluorescent lamp, a blue-violet laser disk for a high-speed and high-density optical memory, and a power device for an inverter for a hybrid car or the like.

Although the present invention has been described with reference to particular embodiments, the invention is not limited thereto and various changes and modification may be made without departing from the scope of the appended claims.

The invention claimed is:

1. A method of producing a composite substrate comprising a sapphire body and a gallium nitride crystal layer grown on said sapphire body and having a thickness of 200 μm in or smaller: said method comprising;
    a step of forming a light absorbing layer comprising a nitride of a group 13 element on said sapphire body;
    a seed crystal film forming step of then forming a seed crystal film comprising gallium nitride crystal on said light absorbing layer;
    a void forming step of then irradiating a laser light onto said light absorbing layer to form voids; and
    a crystal growing step of growing said gallium nitride crystal layer on said seed crystal film by flux method.

2. The method of claim 1, using a pulse laser for said laser light.

3. The method of claim 1, wherein said light absorbing layer comprises gallium nitride crystal.

4. A method of producing a functional layer comprising a nitride of a group 13 element, said method comprising the step of forming a functional layer comprising a nitride of a group 13 element by vapor phase epitaxy process on said gallium nitride crystal layer of said composite substrate obtained by the method of claim 1.

5. The method of claim 4, wherein said functional layer has a function of emitting light.

6. A composite substrate obtained by the method of claim 1.

7. A functional device comprising said composite substrate of claim 6, and a functional layer formed on said gallium nitride crystal layer by vapor phase epitaxy process and comprising a nitride of a group 13 element.

8. The functional device of claim 7, wherein said functional layer has a function of emitting light.

9. The method of claim 1, wherein voids are provided along an interface between said sapphire body and said seed crystal film in a void ratio of 4.5 to 12.5 percent and wherein said sapphire body and said gallium nitride crystal layer are not separated.

* * * * *